Oct. 24, 1967 K. R. SCHONIGER 3,349,341

BROAD BAND SOLID STATE OSCILLATOR

Filed Sept. 16, 1966 3 Sheets-Sheet 1

INVENTOR
Kenneth R. Schoniger
BY
Blair, Buckles & Cesari
ATTORNEYS

United States Patent Office 3,349,341
Patented Oct. 24, 1967

3,349,341
BROAD BAND SOLID STATE OSCILLATOR
Kenneth R. Schoniger, Tampa, Fla., assignor to Trak Microwave Corporation, Tampa, Fla.
Filed Sept. 16, 1966, Ser. No. 580,024
10 Claims. (Cl. 331—117)

This invention relates to microwave sources and, more particularly, to a solid state microwave oscillator having extremely broad band frequency tuning capabilities.

Typically, various frequency multiplication techniques are employed in conjunction with transistor oscillators in order to obtain ultra-high frequency output signals and to achieve extremely broad band frequency tuning. Such multiplication techniques invariably require separate microwave circuitry apart from the microwave circuitry of the transistor oscillator itself. This increases the size and expense of such microwave sources.

It is an object of the present invention to provide an improved solid state microwave oscillator operating at ultra-high frequencies.

An additional object is to provide a microwave oscillator of the above character having extremely broad band tuning capabilities.

A further object is to provide a microwave oscillator of the above character which does not resort to frequency multiplication techniques.

A still further object of the present invention is to provide a microwave transistor oscillator of the above character whose output signal frequency is maintained substantially constant with changes in temperature.

Yet another object is to provide a transistor oscillator of the above character which is inexpensive to manufacture, small in size, and rugged in construction.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims. For a fuller understanding of the nature and objects of the invention, reference should be had to the following detailed description taken in connection with the accompanying drawings, in which:

Similar reference numerals refer to like parts throughout the several views of the drawings.

Figures 1, 2:
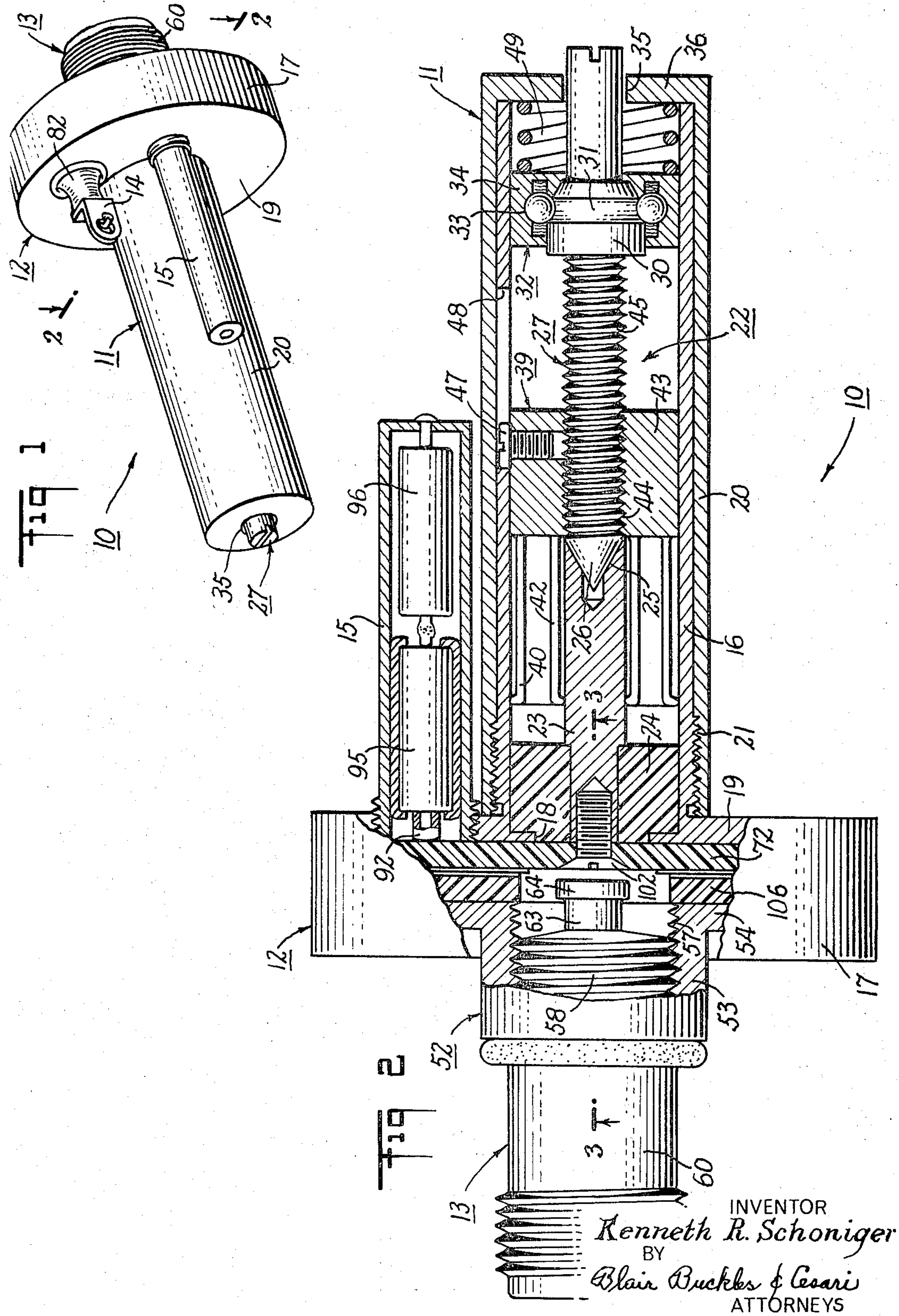
FIGURE 1 is a perspective view of an assembled microwave transistor oscillator embodying the invention.
FIGURE 2 is an enlarged longitudinal sectional view taken along line 2—2 of FIGURE 1.

Referring now to the drawings, the solid state microwave source constructed according to the invention and generally indicated at 10 in FIGURE 1 is enclosed in a housing having an elongated cylindrical portion 11 containing a frequency tuning mechanism and an enlarged diameter housing portion, generally indicated at 12, containing transistor oscillator circuitry. An output connector, generally indicated at 13, communicates with the interior of the housing portion 12 to extract microwave energy for application to an output load (not shown). A terminal 14 facilitates electrical connection to an external DC power supply (not shown) for powering the transistor oscillator circuitry. A smaller housing 15 affixed to housing portion 12 contains lumped parameter circuit elements electrically connected in the transistor oscillator circuit.

Figure 3:
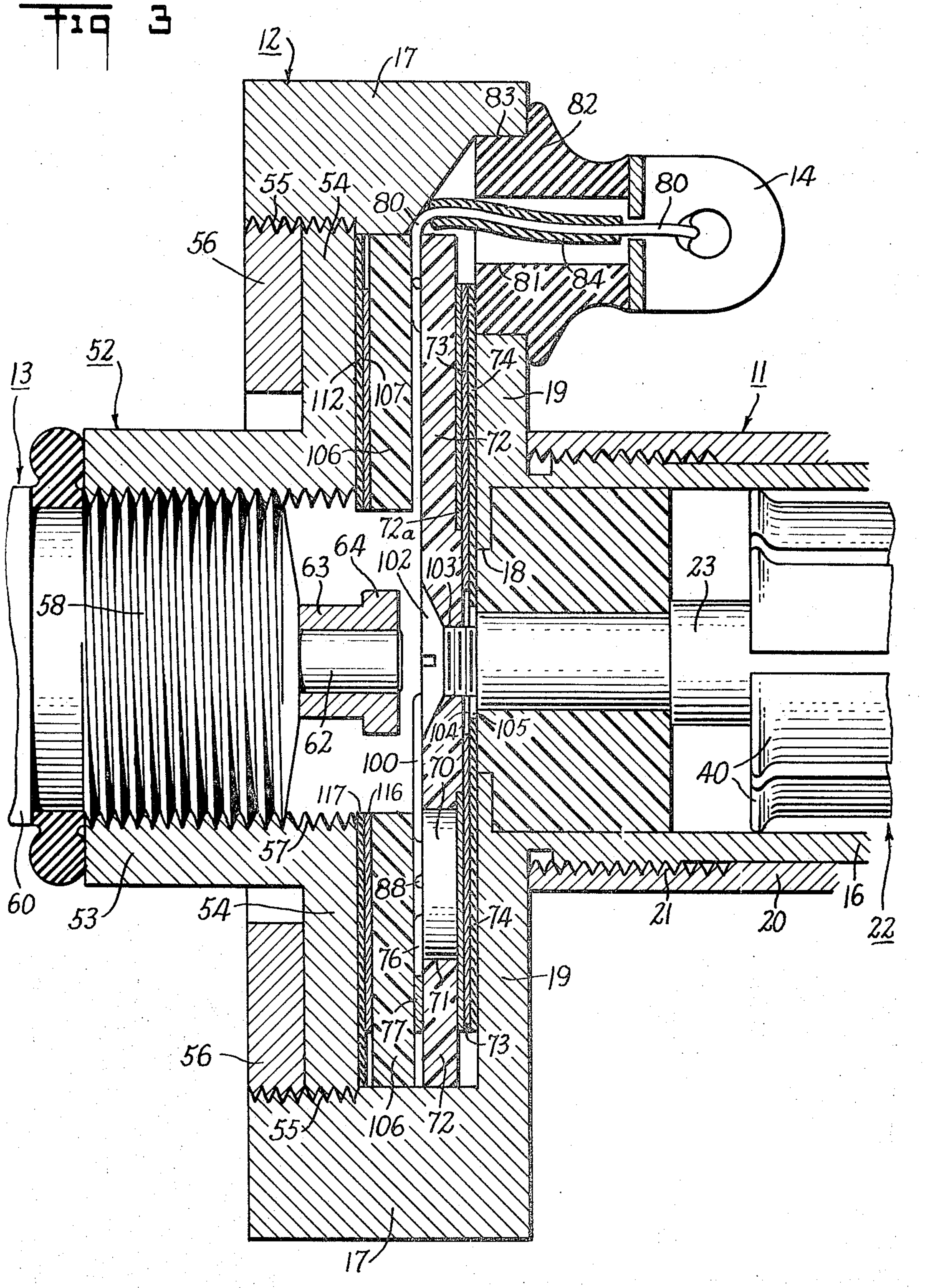
FIGURE 3 is an enlarged sectional view taken along line 3—3 of FIGURE 2.

Turning now to FIGURES 2 and 3, the housing portions 11 and 12 are in part formed by a housing having an elongated, open-ended cylindrical member 16 and a cup-shaped member 17. The interior of the cylindrical member 16 opens into the interior of the cup-shaped member 17 through an aperture 18 formed in the bottom 19 of the cup-shaped member. A cover 20 fits over the member 16 and engages screw threads 21 to enclose a tuning mechanism, generally indicated at 22.

As best seen in FIGURE 2, the tuning mechanism includes a center conductor 23 coaxially mounted within the cylindrical housing member 16. The left-hand end of the center conductor 23 is mounted in the central bore of a dielectric support member 24 fitted in the end of the housing member 16 adjacent the aperture 18. The support member 24 is formed of a suitable dielectric material which is substantially lossless to microwave energy. The right-hand end of the center conductor 23 is countersunk to provide a conical socket 25 for receiving the conical end 26 of a tuning screw, generally indicated at 27. The tuning screw 27 is fitted with a collar 30 whose surface is formed having a circumferential groove 31 constituting the inner race of a ball-bearing assembly, generally indicated at 32. The ball-bearing assembly 32 operates in an outer race 33 formed in an annular bearing support member 34 fitted within the right-hand end of the housing member 16. The right-hand end of the tuning screw 27 projects through an opening 35 formed in the end wall 36 of the cover 20 to permit rotation of the tuning screw from without.

Still considering the construction of the tuning mechanism 22, a plunger, generally indicated at 39, is formed of electrically conductive metal in the shape of a bucket having an outer annular array of resilient fingers 40 urged into sliding electrical contact with the inner surface of the housing member 16. An inner annular array of resilient fingers 42 is arranged for sliding electrical contact over the outer surface of the center conductor 23. The resilient fingers 40 and 42 are supported by a flange 43 having an axial threaded bore 44 engaging threaded shank portion 45 of the tuning screw 27. The flange 43 of the tuning plunger 39 also provides coaxial support for the tuning screw 27 and, by virtue of the engagement of the conical head 26 of the tuning screw with the conical socket 25 in the center conductor 23, the right-hand end of the center conductor as seen in FIGURE 2.

With the above-described construction of the tuning mechanism 22, it is seen that rotation of the tuning screw 27 causes the tuning plunger 39 to move axially along the threaded shank portion 45. A guide screw 47 thread radially into the flange 43 of the tuning plunger 39 has its head accommodated in an axially extending slot 48 formed in the housing member 16. The guide screw 47 prevents the tuning plunger 39 from rotating with the tuning screw 27. A spring 49, compressed between the bearing support block 34 and the end wall 36 of the cover 20, serves to take up any slack in the tuning mechanism 22.

As will be seen from the description to follow, the operation of the tuning mechanism 22 to vary the axial position of the tuning plunger 39 serves to correspondingly vary the distributed inductive parameter of a collector tank circuit formed by the housing member 16, the center conductor 23, and the plunger.

Still referring to FIGURES 2 and 3, a cover, generally indicated at 52, is formed having a sleeve portion 53 and a radially extending flange portion 54. Flange portion 54 is formed having screw threads to engage internal threads 55 formed in the inner circumferential surface of the cup-shaped housing member 17. The cover 52 is held in threaded engagement with the cup-shaped housing member 17 by an annular lock nut 56 also threadingly engaging screw threads 55. The sleeve portion 53 of the cover 52 is formed with an axial threaded bore 57 for engaging the threaded shank 58 of the output connector 13.

The output connector is formed having an outer conductor body 60 and a center conductor 62. The center conductor is supported coaxially within the center conductor 60 by a dielectric sleeve (not shown) as is well known in the art. The inner end of the center conductor 62 is fitted with a probe 63 having one end enlarged in the form of a disc 64 for tighter capacitive coupling of microwave energy to the output connector 13.

The transistor oscillator circuitry of the present invention will now be described in conjunction with FIGURE 4 considered together with FIGURES 2 and 3. A transistor 70, such as a TIX 3016A (Texas Instruments) or its equivalent, is mounted in an aperture 71 formed in a disc 72. The disc 72 is formed of a suitable dielectric material such as is used in the manufacture of strip microwave transmission lines. The bottom surface of the dielectric disc 72 is clad with a layer of copper (not shown), and the case of the transistor 70 serving as a base terminal is electrically connected to this conductor layer.

A thin electrically conductive disc 73 is placed against the copper-clad bottom surface of the dielectric disc 72. An insulating disc 74, formed of mica or the like, is positioned against the bottom surface of the electrically conductive disc 73. In FIGURE 3 it is seen that the assembly of discs 72, 73, and 74 within housing member 16 is such that the insulating disc 74 separates the conductive disc 73 from the bottom 19 of the housing. Thus, the base of transistor 70, electrically connected to the conductive disc 73 by the copper-clad bottom surface of dielectric disc 72, is insulated from the housing at DC, but AC coupled (capacitively bypassed) to the housing at microwave frequencies.

Returning to FIGURE 4, the emitter terminal of transistor 70, indicated at 76, is electrically connected to one end of an arcuate copper strip 77 formed on the upper surface of the dielectric disc 72. The other end of the copper strip 77 is connected to a conventional resistor 78 lodged in a groove 79 formed in the upper surface of the disc 72. The other end of the resistor 78 is connected to one end of an insulated lead 80, which extends along periphery notches in discs 72, 73, 74 and through a central bore 81 in an insulating grommet 82 fitted in an aperture 83 formed in housing member 16. Grommet 82 mounts terminal 14 to which the other end of lead 80 is electrically connected. An insulating sleeve 84 may be provided to encompass the lead 80 to prevent arcing between it and the housing.

Returning to FIGURE 4, an additional base terminal of transistor 70, indicated at 88, is electrically connected to a conventional resistor 89 lodged in a groove 90 formed in the dielectric disc 72. The other end of resistor 89 is electrically connected to the junction between resistor 78 and the lead 80 running to the terminal 14. The junction between resistor 89 and the base terminal 88 of transistor 70 is connected by a lead 92 which extends through apertures in discs 72, 73, 74 and electrically connects to one terminal of a conventional resistor 95 contained in small housing 15. The other terminal of resistor 95 is connected to one terminal of a resistor 96 also contained in small housing 15. The other terminal of resistor 96 is electrically connected to the end wall of housing 15 as seen in FIGURE 2. The housing 15 is at the same electrical potential as the housing portions 11 and 12 which, in the disclosed embodiment, is ground potential.

Figures 4, 5:
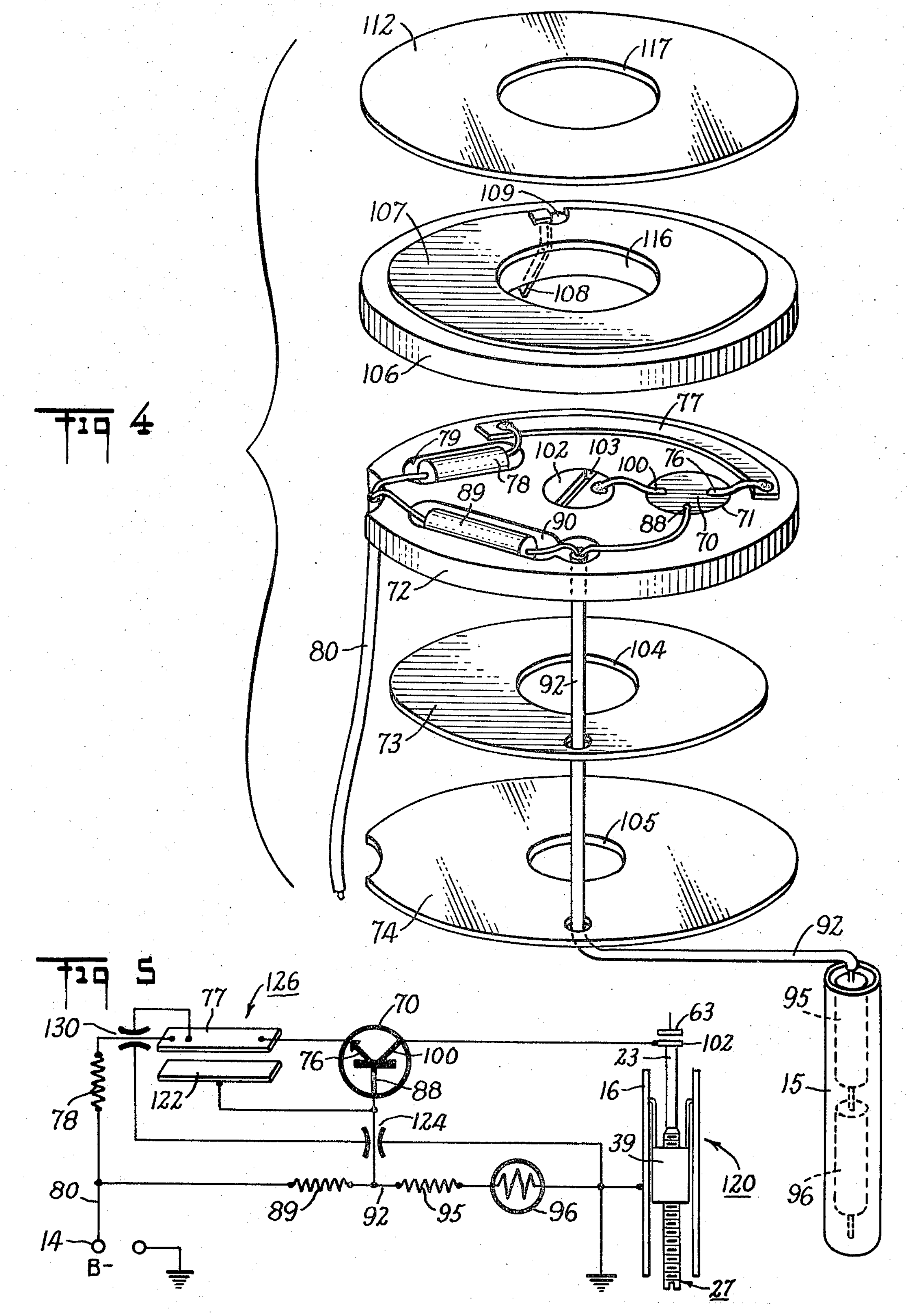
FIGURE 4 is an exploded view showing the manner of assembly of various parts seen in FIGURE 3.
FIGURE 5 is an equivalent circuit schematic diagram of the microwave transistor oscillator of FIGURES 1–4.

It will be appreciated that the length of leads 80 and 92 in FIGURE 4 are exaggerated due to the exploded illustration. In addition, the housing 15 is mounted to the housing member 16 so as to be in alignment with the apertures in discs 72, 73, and 74.

Still referring to FIGURE 4, the collector terminal of transistor 70, indicated at 100, is electrically connected to the head of a screw 102 extending through an aperture 103 in disc 72 and threaded into a left-hand end of the center conductor 23 as seen in FIGURES 2 and 3. The collector 100 of transistor 70 is thereby electrically connected to the center conductor 23 and thus to the collector tank circuit tuned by the tuning plunger 39. Aperture 103 in disc 73 and aperture 104 in disc 74 accommodate the passage of the screw 102 through to its mechanical and electrical inter-engagement with the center conductor 23.

Returning to FIGURE 4, a dielectric disc 106 is formed having a conductor layer 107 to its upper surface. An electrically conductive tab 108, soldered at one end to the conductor layer 107, extends through an aperture 109 in dielectric disc 106 and makes electrical contact along its lower end portion with the arcuate conductive strip 77 on the upper surface of the disc 72 when these two discs are placed in juxtaposition as seen in FIGURE 3. The point of electrical contact of tab 108 with strip 77 is spaced from the end of the strip to which the emitter 76 is connected according to the desired center operating frequency. An insulating disc 112 of mica or the like is positioned against the upper surface of dielectric disc 106. As seen in FIGURE 3, the insulating disc 112 is interposed between the cover 52 and the conductive layer 107 of disc 106. Center apertures 116 in disc 106 and 117 in disc 112 allow the output connector probe 63 to extend to a position in close proximity to the head of the screw 102 for capacitive coupling of microwave energy from the source.

Referring now to the equivalent circuit of the transistor oscillators shown in FIGURE 5, it is seen that the collector terminal 100 of transistor 70 is connected to the collector tank circuit, generally indicated at 120. As previously described, this collector tank circuit is constituted by the coaxial line whose center conductor is the center conductor 23 and whose outer conductor is the cylindrical housing member 16. This coaxial line is terminated by the tuning plunger 39 whose axial position is varied to effectively vary the tank circuit inductance. The extreme range of movement afforded the tuning plunger 39 permits the inductance of the collector tank circuit 120 to be varied over a correspondingly wide range, thus affording the wide band frequency tuning capabilities of the source 10.

The base terminal of transistor 70 constituted by the transistor case is, as was described, in electrical contact with the conductive layer clad to the bottom surface of the disc 72 seen in FIGURE 4. This conductive layer is shown diagrammatically at 122 in FIGURE 5. This conductive layer 122, together with the base of transistor 70, is AC bypassed to the housing of the source 10, by virtue of the positioning of the conductive disc 73 and the insulating disc 74 between the dielectric disc 72 and the housing. This AC bypass is shown diagrammatically as capacitor 124 in FIGURE 5.

Base terminal 88 of transistor 70 is connected through resistor 95 and positive temperature coefficient resistor 96 to the grounded housing and is also connected through resistor 89 to terminal 14. The emitter 76 of transistor 70 is connected to one end of the conductor strip 77 seen in FIGURE 5. The other end of this conductor strip is DC electrically connected through a resistor 78 to the external connector 14 and AC electrically connected to the housing by tab 108 and conductive layer 107. The emitter tank circuit, generally indicated at 126 in FIGURE 5, and formed by the conductive strip 77 and conductive layer 122 positioned on opposing surfaces of the dielectric disc 72 has a Q which enables the oscillator to be tuned over a wide band of frequencies. The emitter of transistor 70 is DC isolated from but AC coupled to the housing through the distributed inductance of tank circuit 126 and the AC bypass provided by the connection of the strip 77 to conductive layer 107 by tab 108. This AC bypass is illustrated diagrammatically by capacitor 130 in FIGURE 5.

Feedback necessary for oscillatory operation is effected through the intrinsic reactance of transistor 70 between its collector and emitter. The distributed inductance of the tank circuit 126, effectively connected between the emitter and base terminals of transistor 70, is of a value to establish proper feedback phase and magnitude at the desired center operating frequency.

The temperature compensation afforded by resistor 96 is as described in my copending application entitled "Temperature Compensated Solid State Microwave Oscillator," Ser. No. 518,829, filed Jan. 5, 1966. As described in this copending application, whose disclosure is specifically incorporated herein by reference, the resistor 96, such as a Texas Instruments PN TM1/8 or Veltor Corp. PN VP1/8, has a large positive temperature coefficient. By virtue of its connection in the oscillator circuitry herein disclosed, the collector-base capacitance is adjusted by the temperature responsive variations in the collector-to-base bias voltage developed by resistor 96 such as to maintain the operating frequency substantially constant over a wide range of temperatures. This automatic adjustment of the collector-base capacitance with temperature variations takes into account temperature-responsive variations in the collector-base capacitance itself as well as dimensional changes in the various distributed parameter oscillator circuits in order to maintain substantially constant operating frequency.

Further contributing to the wide band frequency tuning capability of source 10 is the manner of coupling the transistor 70 to an output load. It is understood that the output load (not shown) would be effectively connected between the center conductor 62 and outer conductor 60 of the output connector 13. The center conductor 62 is capactively coupled to the collector 100 of transistor 70 by virtue of the positioning of the probe 63 in close proximity to the head of screw 102 (FIGURES 2 and 3). The outer conductor 60 of output connector 13 is directly electrically connected to the housing of source 10, and the housing, in turn, is capacitively coupled to the base of transistor 70, as indicated by capacitor 124 in FIGURE 5. Since the output of transistor 70 is developed across its collector and base terminals, and these output terminals are capacitively coupled to the output connector 13, it is noted that the real part of the output impedance seen by the transistor 70 decreases as frequency increases. Since the real part of the impedance between the collector and base terminals of the transistor 70 also decreases as frequency increases, the transistor can remain closely matched to the output load over a wide band of frequencies. A microwave oscillator constructed according to my disclosed invention was found to be tunable over a frequency range in excess of 1000 megacycles from 800 to 2300 megacycles.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. A solid state microwave oscillator comprising, in combination:
- A. a conductive housing;
- B. a center conductor coaxially disposed within said housing;
- C. a transistor mounted within said housing and having
  - (1) a collector terminal electrically connected to said center conductor,
  - (2) a base terminal electrically coupled to said housing, and
  - (3) an emitter terminal;
- D. a conductive tuning coke mounted for axial movement within said housing to frequency-tune a collector tank circuit formed by said housing and said center conductor; and
- E. an emitter tank circuit,
  - (1) said emitter terminal being electrically connected to said emitter tank circuit.

2. The oscillator defined in claim 1 wherein
- (1) said emitter tank circuit is of printed circuit construction.

3. The oscillator defined in claim 1 which further includes:
- A. a coaxial line output connector having
  - (1) an inner conductor probe disposed in close proximity to an end of said center conductor to which said collector terminal is connected,
    - (a) said probe operating to capacitively couple microwave energy developed by said transistor to said output connector.

4. The oscillator defined in claim 1 which further includes:
- A. a resistor having a large positive temperature coefficient,
  - (1) said resistor electrically connected between said base terminal and said housing and operating to temperature-compensate the operating frequency of the oscillator.

5. The oscillator defined in claim 1 which further includes:
- A. a dielectric disc having
  - (1) a conductive strip formed on one flat surface thereof,
    - (a) said emitter terminal electrically connected to one end of said conductive strip,
  - (2) a conductive layer formed on the other flat surface thereof, and
  - (3) an aperture formed therein for accommodating said transistor with said emitter terminal electrically connected to said conductive strip and said base terminal electrically connected to said conductive layer,
    - (a) said conductive strip and said conductive layer cooperating to form said emitter tank circuit.

6. The oscillator defined in claim 5 which further includes:
- A. a conductive disc positioned against said conductive layer, and
- B. a first insulating disc interposed between said conductive disc and said housing to capacitively couple said base terminal of said transistor to said housing.

7. The oscillator defined in claim 6 wherein:
- A. said dielectric disc, said conductive disc, and said first insulating disc have coinciding central apertures through which said center conductor extends for electrical connection to said collector terminal of said transistor.

8. The oscillator defined in claim 6 which further includes:
- A. a second dielectric disc having
  - (1) a second conductive layer formed on a flat surface thereof;

B. a conductive link electrically connecting said second conductive layer to said conductive strip at a point selectively spaced from one end thereof; and C. a second insulating disc interposed between said second conductive layer and said housing such as to capacitively couple said emitter terminal and said emitter tank circuit to said housing.

9. The oscillator defined in claim 8 wherein:

A. said dielectric disc has grooves formed therein to accommodate lumped parameter circuit elements electrically connected in circuit with terminals of said transistor and an external DC power supply such as to develop a requisite biasing potential for oscillatory operation of said transistor.

10. The oscillator defined in claim 1 which further includes:

A. a tuning screw rotatably mounted coaxially within said housing, (1) said tuning screw having a conically shaped end portion received in a conical socket formed in one end of said center conductor, (2) said tuning screw having a threaded shank portion engaging a central threaded bore in said tuning choke such that rotation of said tuning screw causes axial movement of said tuning choke; and B. said tuning choke having (1) an outer annular array of resilient fingers disposed to make sliding electrical contact with said housing, and (2) an inner annular array of resilient fingers disposed to make sliding electrical contact with said center conductor.

No references cited.

ROY LAKE *Primary Examiner.*

JOHN KOMINSKI, *Examiner.*

UNITED STATES PATENT OFFICE
CERTIFICATE OF CORRECTION

Patent No. 3,349,341 October 24, 1967

Kenneth R. Schoniger

It is certified that error appears in the above identified patent and that said Letters Patent are hereby corrected as shown below:

Column 3, line 8, "center" should read -- outer --. Column 4, line 16, after "107" insert -- clad --. Column 6, line 13, "coke" should read -- choke --.

Signed and sealed this 29th day of July 1969.

(SEAL)
Attest:

Edward M. Fletcher, Jr.
Attesting Officer

WILLIAM E. SCHUYLER, JR.
Commissioner of Patents